(12) United States Patent
Nguyen et al.

(10) Patent No.: US 6,238,949 B1
(45) Date of Patent: May 29, 2001

(54) METHOD AND APPARATUS FOR FORMING A PLASTIC CHIP ON CHIP PACKAGE MODULE

(75) Inventors: Luu Nguyen; Ashok Prabhu, both of Sunnyvale; Nikhil Kelkar, Santa Clara; Hem P. Takiar, Fremont, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/336,037

(22) Filed: Jun. 18, 1999

(51) Int. Cl.[7] .................................................. H01L 21/44
(52) U.S. Cl. ........................ 438/106; 438/109; 438/127; 257/777; 257/778; 257/779
(58) Field of Search ..................... 438/106, 109, 438/127; 257/777, 778, 779

(56) References Cited

U.S. PATENT DOCUMENTS 5,663,106 * 9/1997 Karavakis et al. ..................... 29/841
6,069,025 * 5/2000 Kim ....................................... 438/109
6,133,637 * 10/2000 Hikita et al. .......................... 257/777

* cited by examiner

Primary Examiner—Matthew Smith
Assistant Examiner—Belur Keshavan
(74) Attorney, Agent, or Firm—Beyer Weaver & Thomas LLP.

(57) ABSTRACT

A method and an apparatus for forming a plastic chip on chip module is disclosed. The plastic chip on chip module is formed by placing a stacked chip set into a molding chamber suitably arranged to receive encapsulant. The stacked chip set includes a daughter chip that is electrically and mechanically coupled to a mother chip where the daughter chip is directly aligned to and separated from the mother chip by a standoff gap. Encapsulant is then passed into the molding chamber filling the standoff gap substantially simultaneously with surrounding the chip set to form the plastic chip on chip module.

15 Claims, 5 Drawing Sheets

METHOD AND APPARATUS FOR FORMING A PLASTIC CHIP ON CHIP PACKAGE MODULE

FIELD OF THE INVENTION

The present invention relates generally to improved methods and devices for applying protective packaging to integrated circuits. More particularly, techniques for forming a plastic chip on chip package module are described.

BACKGROUND OF THE INVENTION

Semiconductor based integrated circuits dies are created from a silicon wafer through the employment of various etching, doping, and depositing steps that are well known in the art. Ultimately, the integrated circuit may be packaged by forming an encapsulant around the integrated circuit so as to form a "packaged integrated circuit" having a variety of pinouts or mounting and interconnection schemes. Plastic is often utilized as an encapsulant. Integrated circuit packages that utilize plastic as an encapsulant are generally less expensive than other packaging options.

A multichip module is a package having related integrated circuits bonded together in a single package. Typically, the integrated circuits are placed side to side and electrically coupled together using, for example, a substrate or leadframe. This arrangement, however, can, and usually does, result in the multichip module having a large footprint (module's surface area). The large footprint restricts the use of the multichip module to only those applications for which a large footprint is not a substantial problem. However, in such devices as handsets, cordless phone base stations, etc. it is critically important that the footprint of any packaged integrated circuit be reduced as much as possible.

Recent efforts to reduce the footprint of multichip package modules has resulted in a particular multichip module configuration referred to as a chip on chip package module. A chip on chip module is formed by stacking one chip, or chips, atop one another and electrically connecting them by way of corresponding interchip bond pads. One such arrangement is shown in FIG. 1 illustrating a chip on chip module 100 exemplary of a digital signal processing (DSP) module manufactured by the APack Corporation of Taichung City, Taiwan, R.O.C. A daughter chip 102 in the form of a static random access memory integrated circuit is stacked on top of a mother chip 104 in the form of a digital signal processor (DSP). The daughter chip 102 and the mother chip 104 are electrically coupled to each other by way of corresponding interchip bond pads 106 and 108, respectively.

Conventional bonding practices call for each of the bond pads 106 to have a solder ball deposited thereupon which then is used to electrically couple the bond pad 106 to the corresponding bond pad 108 during a subsequent solder reflow operation. A low viscosity insulative material, referred to as fillant 110 or underfill resin, by capillary action alone, fills the region referred to as a standoff 112, or standoff gap, that lies between the daughter chip 102 and the mother chip. Typically, in order for the fillant 110 to flow by capillary action, it's viscosity value ranges from 2,000 to 10,000 cP. Once electrically coupled to the daughter chip 102, bond wires 114 are used to electrically couple bond pads 116 on the mother chip 104 to corresponding leads 118.

Unfortunately, due to the fact that the viscosity of the fillant 110 is an order of magnitude less than that of standard encapsulant, the chip on chip module 100 must be packaged in a ceramic type package 120 which reduces the reliability of the chip on chip module 100 and increases the cost. In addition, the requirement to use a low viscosity fillant 110 requires a multistep encapsulating process where precious manufacturing time and expense is used to manually fill the standoff.

In view of the foregoing, it would be desirable to provide more efficient arrangements for encapsulating chip on chip modules.

SUMMARY OF THE INVENTION

To achieve the foregoing and other objects and in accordance with the purpose of the present invention, a method and an apparatus for forming a plastic encapsulated chip on chip module is disclosed. In one embodiment, the plastic encapsulated chip on chip module is formed by placing a stacked chip set into a molding chamber suitably arranged to receive encapsulant. The stacked chip set includes a daughter chip that is electrically and mechanically coupled to a mother chip where the daughter chip is directly aligned to and separated from the mother chip by a standoff gap. Encapsulant is passed into the molding chamber filling the standoff gap substantially simultaneously with surrounding the chip set to form the plastic encapsulated chip on chip module.

In another embodiment of the invention, a plastic chip on chip package is disclosed. The plastic chip on chip package includes a stacked chip set that includes a daughter chip that is electrically coupled to a mother chip. In a preferred embodiment, the daughter chip is directly aligned to and separated from the mother chip by a standoff gap. The standoff gap having plastic encapsulant contiguously distributed throughout as an integral part of the plastic encapsulant that substantially surrounds the chip set to form the plastic chip on chip package.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention. It should be noted that for the sake of simplicity only, the present invention will be described in terms of a chip on chip module having a single daughter chip electrically coupled to a corresponding mother chip.

A multichip module typically includes a number of related integrated circuits which when appropriately coupled perform a specific range of functions. Typically, multichip modules are used in those situations where fabricating a single integrated circuit capable of performing the desired functions is either technologically or economically infeasible. Such a situation is the use of a multichip module having a digital signal processor as the mother chip and corresponding static random access memory devices as the daughter chips. In this case, fabricating an equivalent single integrated circuit would be prohibitively expensive due to in part to production yield loss. By creating a multichip module instead of a monolithic integrated circuit, the individual components can be adequately tested prior to being electrically connected thereby substantially increasing the production yield over what would otherwise be possible. By stacking the mother and daughter chips one atop the other, a chip on chip module is formed having a substantially reduced footprint making it a desirable choice for such applications as handsets, cordless phone base stations, and any other application where space is limited.

The functional testing of the mother and daughter chips destined for inclusion in a chip on chip module is typically performed at the wafer level. Those daughter chips which are found to be functionally sound are solder bumped at the wafer level, diced, and subsequently electrically coupled to the mother chip during a solder reflow process. The mother chip/daughter chip combination, also referred to as a stacked chip set, is then diced and bond pads found on the mother chip are then electrically coupled to external leads using, for example, a leadframe. A plastic package that surrounds and protects the chip set is then formed when an encapsulant, under pressure, fills the standoff gap substantially simultaneously with surrounding the stacked chip set.

In this way, in contrast to conventional techniques, the packaging costs of a chip on chip module so formed is substantially reduced. In addition, since the encapsulation takes place in a single operation, production costs and time are also substantially reduced thereby expanding the applications for which chip on chip modules are economically feasible.

Figure 1:
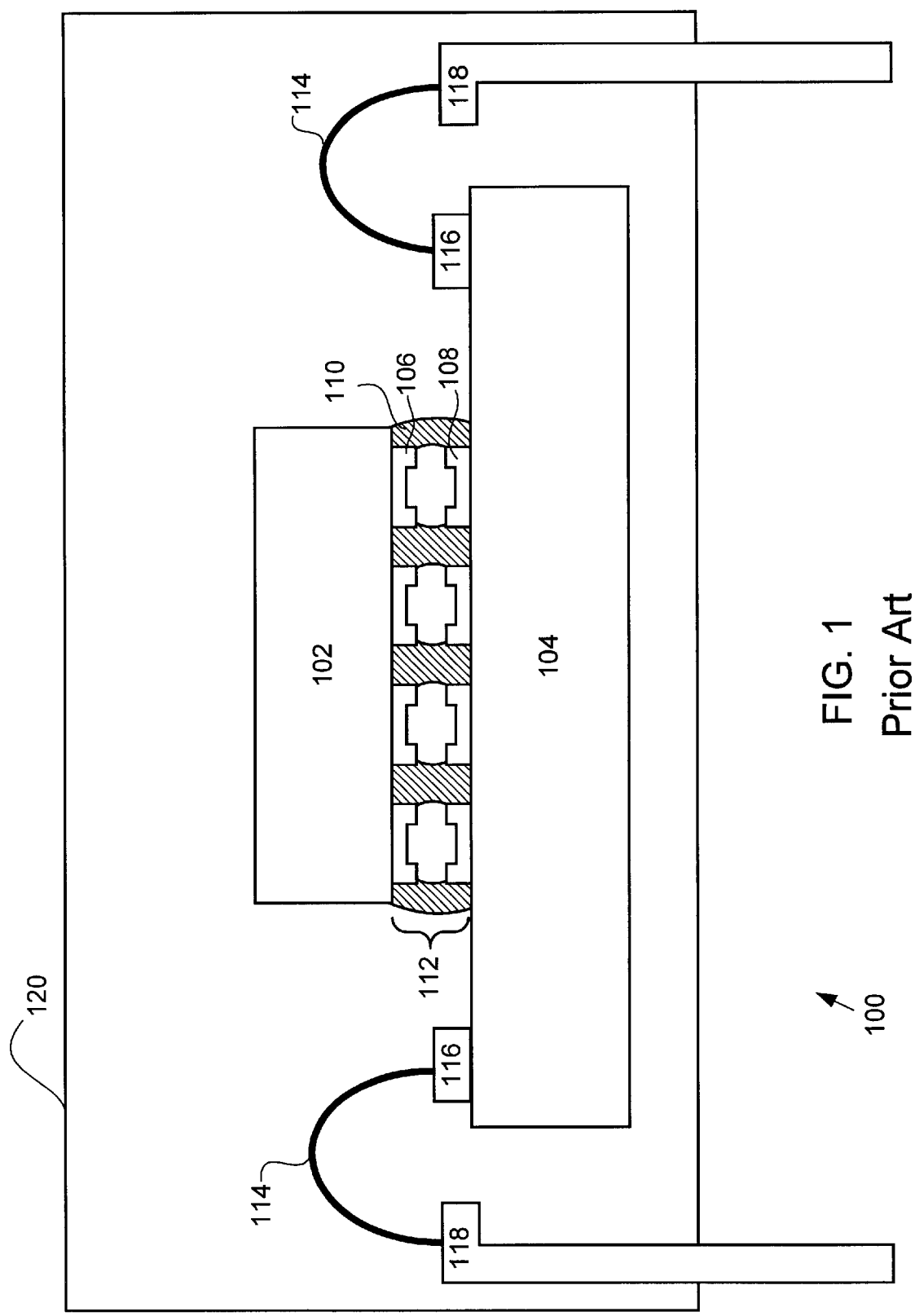
FIG. 1 is an illustration of a chip on chip module packaged in a ceramic package.
Figure 2:
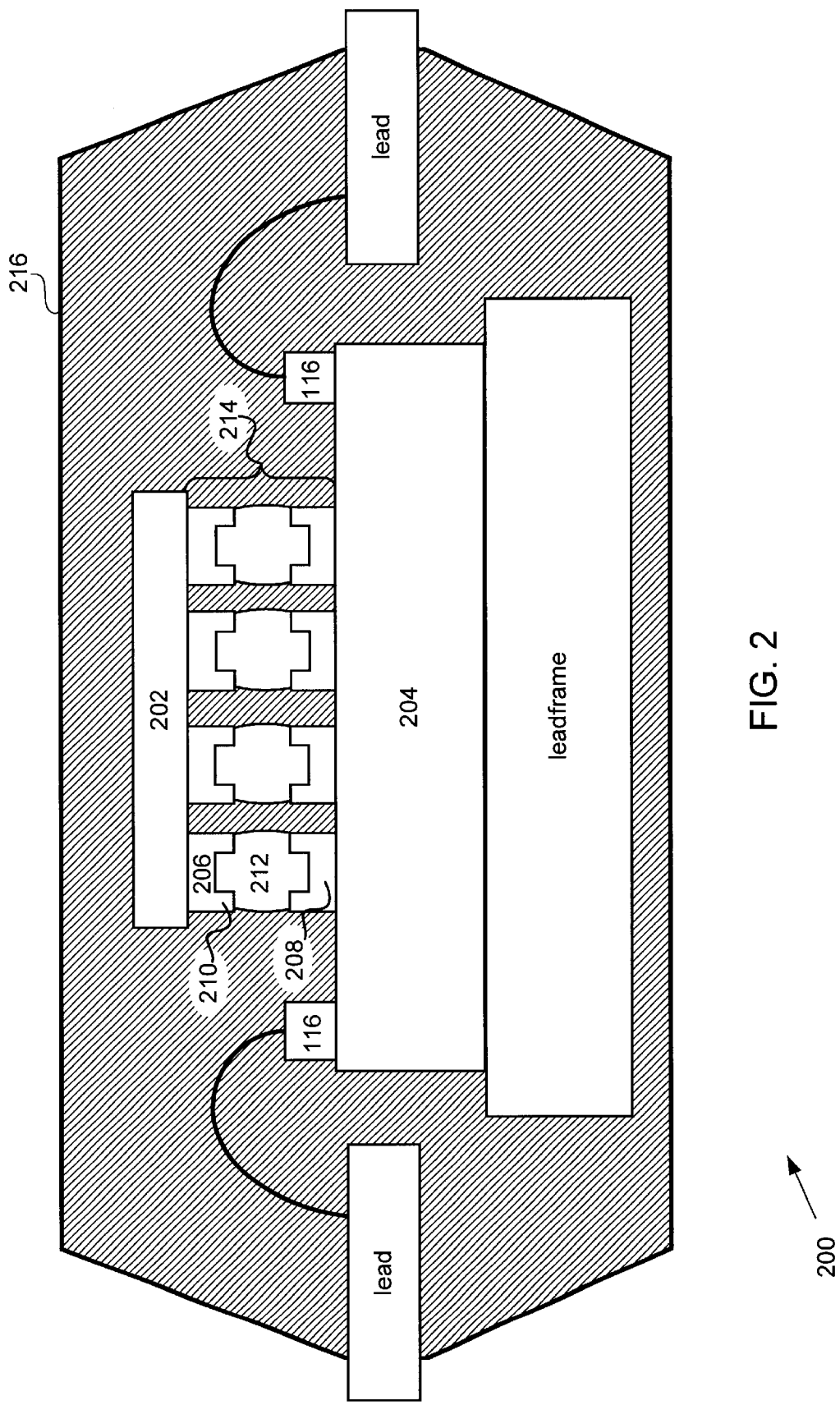
FIG. 2 is a diagrammatic cross sectional view of a chip on chip module encapsulated in plastic in accordance with an embodiment of the invention.

Referring initially to FIG. 2, a chip on chip module in accordance with one embodiment of the invention will be described. FIG. 2 is a diagrammatic side view of a chip on chip module 200. The module 200 includes a daughter chip 202 coupled to a mother chip 204. The daughter chip 202 includes an interchip bond pad 206 that is associated with a corresponding interchip bond pad 208 included in the mother chip 204. It should be noted that the daughter chip 202 and the mother chip 204 are designed specifically to be electrically coupled in this manner since the bond pad 206 must align itself with (in this case directly above) the corresponding bond pad 208.

It should be noted that in the described embodiment, each bond pad includes an underbump barrier layer 210 (also referred to as an underbump metallurgy) that is used to restrain the lateral flow of a solder ball 212 that is typically deposited on the bond pad 206 at the wafer level. In one embodiment of the invention, the solder ball 212 has a radius ranging from approximately 90 microns to 170 microns with a preferred radius of approximately 130 microns. Once solder bumped, the daughter chip 202 is placed flip chip style in proximity to the mother chip 204 such that the bond pad 206 is directly aligned with the corresponding bond pad 208. As well known by those skilled in the art, a solder reflow operation subsequently performed causes the solder ball 212 to adhere to the bond pad 208 forming in the process an electrically conductive path between the bond pad 206 and the bond pad 208.

In the described embodiment, the gap between the mother chip 204 and the daughter chip 202 is referred to as a standoff 214. The standoff 214 must be sufficiently large to allow encapsulant to flow in such a manner as to avoid the formation of voided regions between the mother and daughter chips. The presence of voids presents potential reliability problems due to poor heat transfer causing localized heat buildup which in some cases can result in thermal cracking of either or both the mother and/or daughter chip. In extreme cases, the excess heat can result in voids forming between the bond pads and the solder when the local temperatures approach the solder reflow temperature. On the other hand, the standoff 214 must not be so large as to substantially hinder the formation of a low resistance conductive path between the bond pads 206 and 208. If, for example, the standoff 214 is too large, the solder ball 212 will be of insufficient size and volume to adequately couple the bond pads 206 and 208. In extreme cases, no conductive path is formed and the device will be non-functional. However, a more ominous outcome occurs when a conductive path is formed but by its very nature has inadequate long term reliability characteristics. Such is the case when the solder connection between the bond pads 206 and 208 is thin such that high current densities cause electromigration which in the long term can result in functional failure of the device.

In the described embodiment, therefore, by having the standoff 214 range from approximately 4 mils to approximately 6 mils with a preferred value of approximately 5 mils, standard encapsulant such as ECN epoxy can be used to fill the standoff gap 214 without forming voids. In addition, providing solder balls in the above described range substantially assures that a good electrically conductive path is formed between the bond pads 206 and 208 during solder reflow. In this way, the encapsulant used to form the package 216 that surrounds and protects the mother chip 204 and the daughter chip 202 can be the same encapsulant used to fill the standoff 214. By utilizing the same encapsulant, such as ECN epoxy, to form the package 216 as is used as a fillant for the standoff 214, the package 216 can be formed in a single encapsulation operation without resorting to extra processes as is required in conventional techniques.

In the described embodiment, ECN (Epoxy Cresol Novolac) based epoxy having an 80% by weight filler density is contemplated as one of the encapsulants of choice. By 80% by weight filler density it is meant that 80% by weight of a given sample of the ECN encapsulant takes the form of fillers. Typically, fillers are spherical particles of $SiO_2$ having a mean radius that is less than ⅓ the size of the standoff 214 that are used to promote thermal heat transfer as well as reduce mechanical stress between the mother chip 204 and the daughter chip 202 (which themselves are formed of $SiO_2$).

The molding compound for the package can be either an ECN based or a bi-phenyl based epoxy molding compound. It should be noted that any molding compound selected should have a filler loading between 70% to 90% by weight. This filler concentration results in a low coefficient of thermal expansion that minimizes the thermal mismatch between the daughter and mother chips during temperature excursions. As measured by the standard spiral flow test well known by those skilled in the art, the mold compound viscosity should range from approximately 80 cm to approximately 120 cm.

Figure 3:
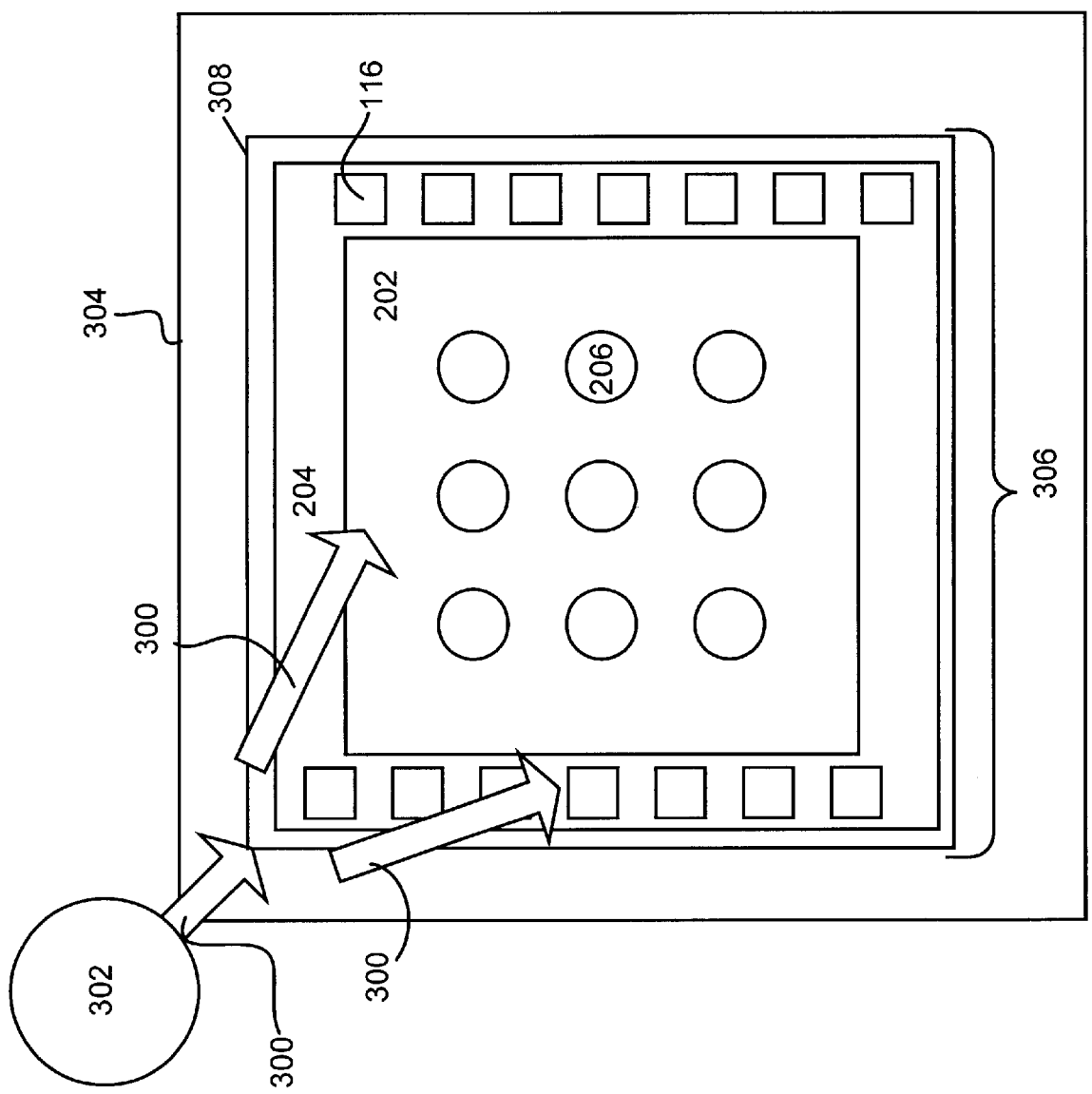
FIG. 3 is a transparent top view of a stacked chip set in a molding chamber during encapsulation in accordance with an embodiment of the invention.

In one embodiment of the invention, the encapsulant (such as ECN based epoxy) is applied in a fashion illustrated in FIG. 3 which is a transparent top view of a stacked chip set described in FIG. 2. In the described embodiment, the encapsulant 300 is stored in a receptacle 302 (referred to in some cases as a pot) until it is forced under pressure to flow into a reservoir 304 (that approximately takes the shape of the protective package) containing a stacked chip set 306. The encapsulant 300 flows in such a manner as to substantially simultaneously fill the standoff 214 as well as surround the stacked chip set 306 until such time as the reservoir 304 is filled forming a package 308 in the process.

Figure 4:
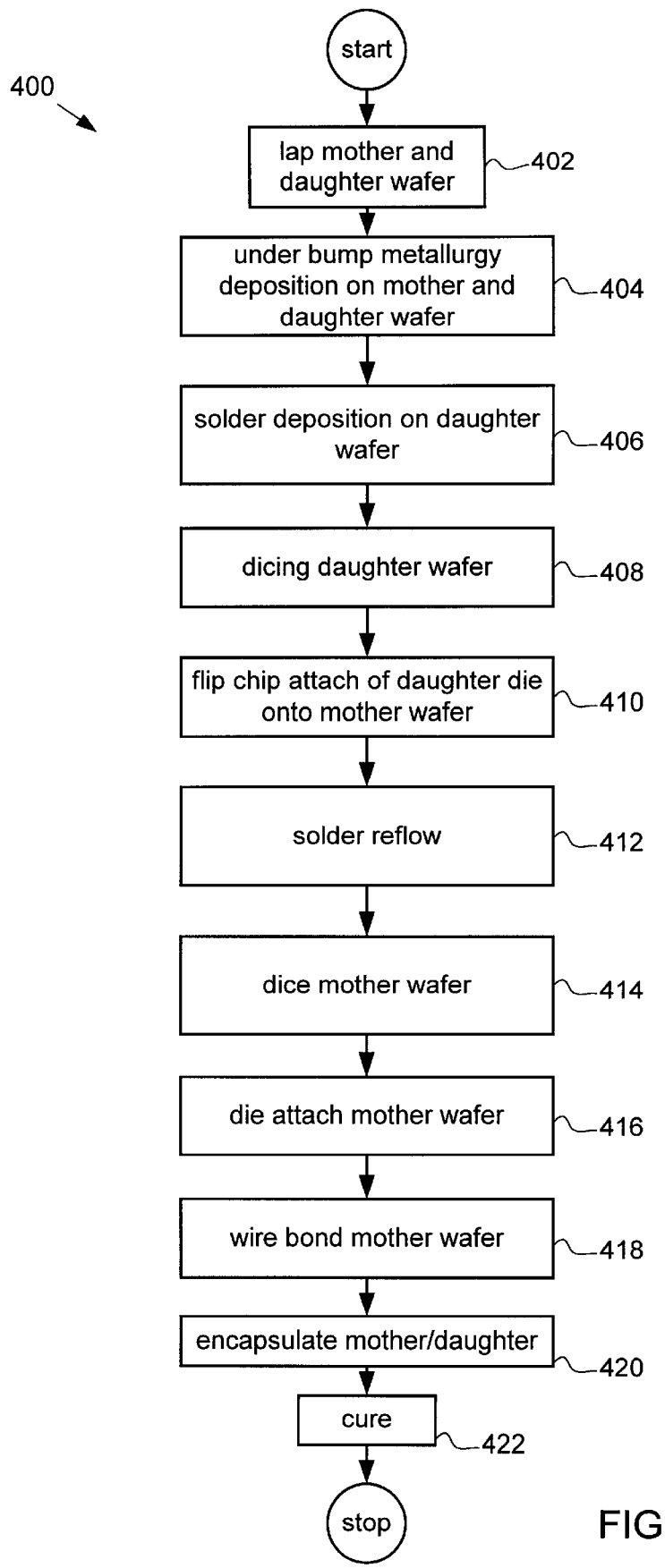
FIG. 4 is a flowchart detailing a process for forming a plastic chip on chip package in accordance with an embodiment of the invention.

FIG. 4 is a flowchart detailing a process 400 for forming a chip on chip module in accordance with an embodiment of the invention. In the described embodiment, a wafer containing a plurality of mother dies and a wafer containing a plurality of daughter dies are lapped at 402. By lapped it is meant that the thickness of the corresponding wafers are reduced so as to fit within the prescribed dimensions of the chip on chip module. In one embodiment, an eight-inch wafer having a thickness of 30 mils is reduced (lapped) to a range of approximately 8 mils to 30 mils with a preferred thickness of approximately 15 to 16 mils. At 404, an underbump is applied to bond pads included in the mother chip and the daughter chip. Typically, the underbump is applied to those bond pads for which a solder ball will subsequently be deposited and reflowed. The underbump metal layers substantially prevents excessive lateral flow of the solder during the solder reflow operation. The underbump metal layers also act as a barrier metal between the bond pad and the solder.

At 406, solder balls are deposited on the interchip bond pads included in the daughter wafer after which the daughter wafer is diced at 408. By diced it is meant that each daughter die is individualized, otherwise referred to as singulated to form a plurality of individual dies. Once singulated, the daughter die is attached flip chip style to a corresponding one of the mother dies on the mother wafer at 410. A conventional solder reflow operation is then performed at 412 resulting in the formation of an electrically conductive path between the mother chip and the daughter chip. The mother wafer is then diced at 414 and the resulting mother chip/daughter chip combinations are selected for assembly.

In the described embodiment, bond pads on the mother chip is attached to a substrate at 416 after which it is electrically coupled to external leads using, for example, a lead frame at 418. It should be noted, however, that any other appropriate method of coupling the mother chip to external circuitry is appropriate and should not be construed as being limited only to the use of leadframes.

At 420, a molding operation using encapsulant is performed. In a preferred embodiment, the encapsulant is applied in a uniform manner using, for example, pressure applied to a gangpot arrangement. By using standard molding techniques, the chip on chip is encapsulated in plastic without resorting to additional production operations with the concomitant yield loss and production overhead. At 422, the encapsulant is cured, the leads are trimmed, and the plastic chip on chip module is ready for post assembly testing, both functional and environmental.

Figure 5:
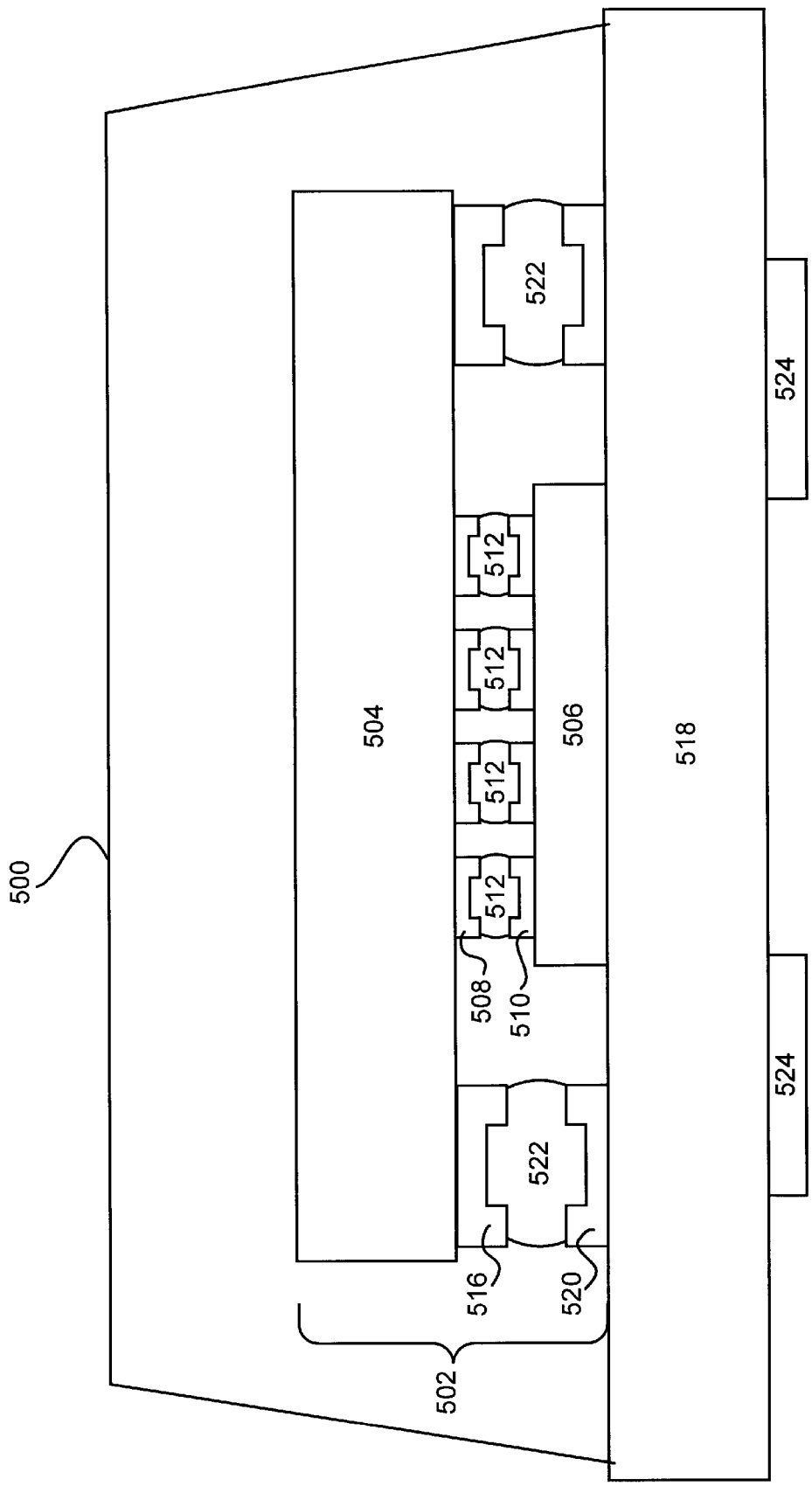
FIG. 5 is an illustration of another implementation of a stacked chip set in accordance with an embodiment of the invention.

FIG. 5 is an illustration of another implementation of a chip on chip package 500 having a stacked chip set 502 in accordance with an embodiment of the invention. The stacked chip set 502 includes a mother chip 504 and a daughter chip 506. The mother chip 504 is stacked flip chip style over the daughter chip 506. A plurality of interchip bond pads 508 and 510 located on the mother chip 504 and the daughter chip 506, respectively, are used in conjunction with a solder ball 512 to electrically couple the mother chip 504 and the daughter chip 506. The mother chip 504 also includes a bond pad 516 that is coupled to a substrate 518 by way of a bond pad 520 and solder ball 522. The bond pad 520, in turn, is electrically coupled to external circuitry using, for example, a solder bump 524. In this arrangement, the footprint of the chip on chip package 500 is further reduced. The mother chip 504/daughter chip 506 structure is then assembled onto a substrate 518 that is subsequently overmolded to form the package 500. As shown, the daughter chip 506 is backlapped to a thickness in the range of less than 10 mils. The reduced thickness permits the connection of the mother chip 504 to the substrate 518 with sized solder balls 522 having a radius ranging from approximately 13 mils to approximately 15 mils. In this way, the mold compound will flow and encapsulate the standoff gaps between the mother chip 504 and the daughter chip 507 as well as between the mother chip 504 and the substrate 518.

Although, several embodiments of the present invention have been described in detail, it should be understood that the present invention may be embodied in many other specific forms without departing from the spirit or scope of the invention. Particularly, shape and form of the package recesses may be any deemed appropriate and suitable for the application desired. Further, the present invention is not limited to a single mother chip and a single daughter chip. Rather, the package and mold configuration detailed above are used as an example to illustrate the simplicity of the method and apparatus for forming a plastic chip on chip module according to the present invention and its advantages over conventional methods of forming the same.

Also, future developments such as laser etching technology or improved techniques in package molding compound technology can be readily incorporated in the advantages of the present invention. The invention has been primarily described in the context of chip on chip modules that contain a single mother die and a single daughter die. However, the described technique is equally applicable to packaging chip on chip modules with any number of mother and/or daughter dies. Therefore, the present examples are to be considered as illustrative and not restrictive, and the invention is not to be limited to the details given, herein, but may be modified with the scope of the appended claims. Standoff distance ranges can vary, optimal numbers will depend in large part on the material used as the encapsulant, but generally will be in the range of approximately 4 mils to at least approximately 6 mils.

What is claimed is:

1. A method of forming a plastic chip on chip package wherein the plastic chip on chip package includes a stacked chip set that includes a daughter chip that is electrically and mechanically coupled to a mother chip, wherein the daughter chip is directly aligned to and separated from the mother chip by a standoff gap, the method comprising:

placing the stacked chip set into a molding chamber suitably arranged to receive an encapsulant;

passing the encapsulant into the molding chamber; and filling the standoff gap while substantially simultaneously surrounding the chip set with the encapsulant thereby substantially encapsulating the daughter chip and the mother chip within the molding chamber by the encapsulant; and curing the encapsulant to form the plastic chip on chip package.

2. A method as recited in claim 1 wherein the daughter chip has a first plurality of interchip bond pads.

3. A method as recited in claim 2, wherein the mother chip has a second plurality of interchip bond pads, wherein most of the second plurality of interchip bond pads are each associated with one of the first plurality of interchip bond pads.

4. A method as recited in claim 3, wherein the mechanical coupling comprises:

depositing a solder ball on selected ones of the first plurality of interchip bond pads;

placing the daughter chip in proximate position of the mother chip such that the selected bond pads are directly aligned with corresponding ones of the second plurality of interchip bond pads; and reflowing the solder ball such that the solder bridges the standoff gap in such a way as to promote an electrically conductive path between each of the selected bond pads and the corresponding ones of the second plurality of interchip bond pads.

5. A method as recited in claim 4, wherein the encapsulant is selected from a group comprising ECN based epoxy mold compound and bi-phenyl based epoxy mold compound.

6. A method as recited in claim 4 wherein the standoff gap is approximately at least 4 mils and is at most approximately 6 mils.

7. A method as recited in claim 6 wherein the standoff gap is approximately 5 mils.

8. A method of forming a plastic chip on chip package wherein the plastic chip on chip package includes a stacked chip set that includes a daughter chip that is electrically and mechanically coupled to a mother chip, wherein the daughter chip is directly aligned to and separated from the mother chip by a standoff gap, comprising:

filling the standoff gap while substantially simultaneously surrounding the chip set with encapsulant thereby substantially encapsulating the daughter chip and the mother chip by the encapsulant; and curing the encapsulant to form the plastic chip on chip package.

9. A method as recited in claim 8, further comprising:

placing the stacked chip set into a molding chamber suitably arranged to receive encapsulant; and passing the encapsulant into the molding chamber.

10. A method as recited in claim 8 wherein the daughter chip has a first plurality of interchip bond pads.

11. A method as recited in claim 10, wherein the mother chip has a second plurality of interchip bond pads, wherein most of the second plurality of interchip bond pads are each associated with one of the first plurality of interchip bond pads.

12. A method as recited in claim 11, wherein the mechanical coupling comprises:

depositing a solder ball on selected ones of the first plurality of interchip bond pads;

placing the daughter chip in proximate position of the mother chip such that the selected bond pads are directly aligned with corresponding ones of the second plurality of interchip bond pads; and reflowing the solder ball such that the solder bridges the standoff gap in such a way as to promote an electrically conductive path between each of the selected bond pads and the corresponding ones of the second plurality of interchip bond pads.

13. A method as recited in claim 8, wherein the encapsulant is selected from the group comprising ECN based epoxy mold compound and bi-phenyl based epoxy mold compound.

14. A method as recited in claim 8 wherein the standoff gap is approximately at least 4 mils and is at most approximately 6 mils.

15. A method as recited in claim 8 wherein the standoff gap is approximately 5 mils.

\* \* \* \* \*